(12) United States Patent
Lee et al.

(10) Patent No.: US 8,431,932 B2
(45) Date of Patent: Apr. 30, 2013

(54) LIQUID CRYSTAL DISPLAY DEVICE AND MANUFACTURING METHOD THEREOF

(75) Inventors: Yi-Wei Lee, Hsin-Chu (TW); Ching-Yun Chu, Hsin-Chu (TW)

(73) Assignee: AU Optronics Corp., Hsinchu (TW)

( * ) Notice: Subject to any disclaimer, the term of this patent is extended or adjusted under 35 U.S.C. 154(b) by 9 days.

(21) Appl. No.: 13/343,176

(22) Filed: Jan. 4, 2012

(65) Prior Publication Data
US 2012/0104400 A1    May 3, 2012

Related U.S. Application Data

(62) Division of application No. 11/797,679, filed on May 7, 2007, now Pat. No. 8,110,452.

(30) Foreign Application Priority Data

Aug. 14, 2006    (TW) ............................... 95129754 A

(51) Int. Cl.
*H01L 33/08*    (2010.01)
(52) U.S. Cl.
USPC ................. 257/59; 257/72; 257/E33.053
(58) Field of Classification Search .............. 257/49–75, 257/E33.053
See application file for complete search history.

(56) References Cited

U.S. PATENT DOCUMENTS

| 5,397,718 | A | * | 3/1995 | Furuta et al. | ................. | 438/158 |
| 6,952,036 | B2 | * | 10/2005 | Suzuki et al. | ................. | 257/347 |
| 7,411,212 | B2 | * | 8/2008 | Fang et al. | ..................... | 257/59 |
| 7,564,531 | B2 | * | 7/2009 | Yasuda et al. | ................. | 349/147 |
| 2002/0168805 | A1 | | 11/2002 | Lee | | |

FOREIGN PATENT DOCUMENTS

| CN | 1489790 | | 4/2004 | | |
| CN | 1834740 | | 9/2006 | | |
| JP | 3159174 | * | 7/1991 | ....................... | 1/136 |

* cited by examiner

*Primary Examiner* — Matthew W Such
*Assistant Examiner* — Ali Naraghi
(74) *Attorney, Agent, or Firm* — Bacon & Thomas, PLLC

(57) ABSTRACT

A lower substrate for a liquid crystal display device and the method of making the same are disclosed. The method includes steps of: (a) providing a substrate; (b) forming a patterned transparent layer having plural recess on the substrate; (c) forming a first barrier layer on the surface of the recess; (d) coating a first metal layer on the first barrier layer and making the surfaces of the first metal layer and the transparent layer in substantially the same plane; and (e) forming a first insulated layer and a semi-conductive layer in sequence. The method further can optionally comprise the steps of: (f) forming a patterned second metal layer, wherein part of the semi-conductive layer is exposed, thus forming the source electrode and the drain electrode; and (g) forming a transparent electrode layer on part of the transparent layer and part of the second metal layer.

19 Claims, 10 Drawing Sheets

LIQUID CRYSTAL DISPLAY DEVICE AND MANUFACTURING METHOD THEREOF

This application is a divisional application of pending U.S. patent application Ser. No. 11/797,679, filed May 7, 2007 (of which the entire disclosure of the pending, prior application is hereby incorporated by reference).

BACKGROUND OF THE INVENTION

1. Field of the Invention

The present invention relates to a liquid crystal display (LCD) device and the manufacturing method thereof, and more particularly, to a liquid crystal display (LCD) device with a low resistance line structure and the manufacturing method thereof.

2. Description of Related Art

In consideration of the manufacturing cost of integrated circuits and the rate of unit operation, the manufacturing technology of integrated circuits has evolved to ULSI (ultra large scale integration) so as to make the metal interconnection in the back-end of line tend to be multilayered and miniaturized. However, the first issue caused by the miniaturization of metal interconnection is the reduction of signal transmission rate, resulting from the capacitance formed from the dielectric layers between metal lines.

The circuit signal transmission rate depends on the value of resistance (R)×capacitance (C), i.e., the smaller the value of R×C, the faster the transmission rate. The conventional methods resolving resistance capacitance time delay (RC Delay) use the metals with lower resistance coefficient as metal lines or taking the materials with lower dielectric coefficient as the dielectric materials between metal layers, so as to enhance the line signal transmission rate.

LCD devices, as compared to typical Cathode Ray Tube monitors, have the advantages of low power consumption, small volume and non-radiation. Because development of thin-film transistor LCD devices is following the large-sized and high-resolution requirements, RC delay is serious. In order to enhance a TFT driving signal transmission rate, a metal having a low resistance rate, such as copper, silver and gold, is used as the metal line or the gate line of a flat panel display substrate to resolve RC delay.

Some problems arising from the utilization of copper materials need to be resolved, including fast oxidation, moisture corrosion, poor adherence, and inter-diffusion. In general, the multilevel structure is used for resolving the above disadvantages, but the copper lines in the multilevel structure increase the difficulty in the subsequent etching process.

The metal lines of conventional panels are designed as Al/Ti or Ti/Al/Ti (TiN), but the problem of the conventional design is high sheet resistance. In addition, when the panel has broken lines or foreign matter blocking the circuit, repair lines are usually needed to overcome the defect. However, the signal pathway is two to three times longer than the original pathway. As shown in FIG. 1A, when the circuit A from SATB5 line has the broken line 500 in the panel, the repair line (circuit B) is taken as the current source. The pathway of the repair line longer than the original path causes RC delay time to increase and the signal is weakened to form the irreparable weak-line. Thereby, the repair does not have efficiency.

In addition, after dry etching Gate 100 profile in TFT structure formed by the conventional process, the angle between the gate profile and the substrate 00 should be 60°~80°, as shown in FIG. 2A. In practice, Gate 100 is in non-normal form and the profile is 90°, as shown in FIG. 2B. When the insulated layer 200 is sputtered on the gate, the step coverage of the insulated layer on the gate is worse and a crack 201 is formed. Thereby, S-G leakage comes into existence and the yield is influenced. Therefore, the inlay type gate line can prevent the above defects.

Although it is known that the utilization of copper can improve the above difficulties in the design of the conventional panel, a further problem of mismatched resistance occurs. Thereby, the improvement in the material can avoid the above difficulties in designing a panel, and the efficiency of manufacturing panels can be enhanced.

SUMMARY OF THE INVENTION

The object of the present invention is to provide a manufacturing method of a thin-film transistor matrix substrate (TFT substrate) for an LCD device, which can form directly a TFT structure with an inlay type gate line and a repair line structure to reduce the resistance of wires in the panel efficiently. Thereby, the repair of a broken line is improved, and the yield of the product is also enhanced indirectly. Furthermore, the addition of other units in developing products which increases the developing cost to repair broken lines is avoided.

The manufacturing process of the TFT substrate used for the LCD device of the present invention includes (a) providing a substrate; (b) forming a patterned transparent layer having plural recess on the substrate; (c) forming a first barrier layer on the surface of the recess; (d) coating a first metal layer on the first barrier layer and making the surfaces of the first metal layer and the transparent layer in substantially the same plane; and (e) forming a first insulated layer and then forming a semi-conductive layer on the first metal layer and the part transparent layer.

According to the above steps of the present invention, the line structure of the matrix substrate used for an LCD device is accomplished. The manufacturing method of the matrix substrate for the LCD device in the present invention can further include: (f) forming a patterned second metal layer on the surfaces of the semi-conductive layer and the part patterned transparent layer, and exposing the part of semi-conductive layer to establish a drain electrode and a source electrode of a thin-film transistor; and (g) forming a transparent electrode layer on the part of the transparent layer and the partial surface of the second metal layer surface of the drain electrode. By the step (f) and the step (g), the TFT structure is accomplished.

The present invention further provides a TFT structure with an inlay type gate line, including: a substrate; a transparent layer of plural recess filled with a first metal layer and a first barrier layer which is sandwiched in between the first metal layer and the transparent layer; an insulated layer formed on the first metal layer; a semi-conductive layer formed on the insulated layer; a source metal layer and a drain metal layer formed on the part edge of the semi-conductive layer, where the source metal layer does not electrically connect with the drain metal layer; and a transparent electrode layer formed on the part transparent layer and the part drain metal layer which electrically connects with the transparent electrode layer.

In the TFT structure of an inlay type gate line in the present invention, a second barrier layer can further locate between the first metal layer and the insulated layer.

In the method or the structure of the present invention, the material of the semi-conductive layer is not limited. Preferably, the material of the semi-conductive layer is an amorphous silicon layer or a poly-silicon layer. The non-limited material of the transparent layer can be any conventional material with transparency, translucency or transparency only in a certain thickness. Preferably, the thickness of the amorphous silicon layer is 500 Å to 2000 Å.

The first barrier layer of the present invention can make the sheet resistance more controllable and thereby the sheet resistance of the first metal layer can be controlled in an ideal scope. Moreover, diffusion of the alkali metal ions of the base material into the seed layer is avoided; and the material of the seed layer and copper diffuse into the substrate. Thereby, before the seed layer is deposited on the substrate, the first barrier layer of the present invention is preferably deposited on the substrate.

Preferably, the material of the first barrier layer of the present invention is not limited, including a material selected from the group consisting of silica, silicon nitride (SiNx), aluminum oxide, tantalum oxide, titanium nitride (TiN), indium tin oxide, silicon carbide, silicon carbide doped with nitrogen and oxygen, molybdenum, chromium, titanium, nickel, tungsten, ruthenium, cobalt, phosphorus and a combination thereof. More preferably, the material of the first barrier layer is titanium nitride.

In the method of the present invention, the step (c) is depositing the first barrier layer on the substrate surface by physical vapor deposition, chemical vapor deposition, evaporation, sputtering or plating. Herein, plating can be electroplating, electroless or auto catalytic plating. Preferably, the step (c) of the process is depositing the first barrier layer on the surface of the substrate by electroless or auto catalytic plating. The thickness of the first barrier layer is not limited. Preferably, the thickness range is 500 Å to 1000 Å.

After the step (c) and before the step (d) of the present invention, a seed layer can be further formed on the first barrier layer, step (c1). The material of the seed layer in the present invention is not limited. Preferably, the material includes a metal selected from the group consisting of gold, silver, copper, nickel, tungsten, molybdenum, cobalt, ruthenium, titanium, zirconium, hafnium, niobium, tantalum, vanadium, chromium, manganese, iron, palladium, platinum, aluminum and a combination thereof. Moreover, a material as that of the copper layer, an alloy of the above metals or a derivate of the above metal doped with the element including phosphorus or boron, can be also the material of the seed layer in the present invention.

The seed layer in the present invention can inhibit or reduce the diffusion of the metal ions of the first metal layer into the material of the base layer, and enhances the adhesion between the materials of the base layer and the first metal layer. In a preferred embodiment, the seed layer is formed by a seed solution at least containing metal salts, pH adjustors, surfactants, moistening agents and acid catalysts.

Moreover, the step forming a seed layer in the present invention can be any process forming a seed layer on the substrate. Preferably, the process depositing a seed layer on the surface of the flat display substrate in the present invention is physical vapor deposition, including IMP-PVD; chemical vapor deposition, including plasma enhanced chemical vapor deposition and thermal chemical vapor deposition; evaporation, including metal evaporation; sputtering, including long throw sputtering and collimated sputtering; or plating, including electroless and electroplating of a wetting process.

Preferably, the seed layer of the present invention is formed on the surface of the substrate by electroless or auto catalytic plating. Preferably, the thickness range of the seed layer is 1500 Å to 4000 Å.

In a preferred embodiment of the present invention, a metal layer can be deposited in the recess of the transparent layer on the substrate to be the first metal later by the process including chemical plating or autocatalytic plating. The preferred first metal layer of the present invention is copper or a copper alloy. Preferably, the thickness range of the first metal layer in the present invention is 1500 Å to 4000 Å.

The step (d) of the present invention can be further followed by a step (d1), wherein a second barrier layer is formed on the surface of the first metal layer. The material of the second barrier layer is not limited. Preferably, the material is selected from the group of consisting of silica, silicon nitride, aluminum oxide, tantalum oxide, titanium nitride, indium tin oxide, silicon carbide, silicon carbide doped with nitrogen and oxygen, molybdenum, chromium, titanium, nickel, tungsten, ruthenium, cobalt, phosphorus, and combinations thereof.

In the present invention, the preferred method in the step (d), i.e., making the surfaces of the second barrier layer and the transparent layer in substantially the same plane, is that according to the transparent layer as the end of etching, the surfaces of the barrier layer and the transparent layer are in substantially the same plane by wet etching or Chemical Mechanical Planarization (CMP). In addition, the second barrier layer of the present invention is treated by annealing and thereby a preferred embodiment of the present invention is forming a $CuSi_x$ layer on the surface of the first metal layer of copper so as to make the copper metal as the line having lower contact resistance. Moreover, the thickness of the second barrier layer in the present invention is not limited. Preferably, the thickness of the second barrier layer is 500~1000 Å.

In the present invention, the preferred wet etching is performed by an etching liquid comprised of $H_2O_2$, $H_2SO_4$, acetanilide, sodium phenol sulfonate and sodium thiosulfate.

Moreover, in the manufacturing process of the matrix substrate for the LCD device of the present invention, the flat display substrate is not limited. Preferably, the flat display substrate is a silicon substrate, a glass substrate or a plastic substrate. An active matrix flat display substrate is more preferable, including an undoped silicon glass, a phosphosilicate glass (PSG), a boro-phosphor-silicate glass, a soda-lime glass, a borosilicate glass, a sodium borosilicate glass, an alkali-metal borosilicate glass, an aluminosilicate glass, an aluminoborosilicate glass, an alkali-earth aluminoborosilicate glass or a combination thereof, but is not limited thereto.

The manufacturing method of the matrix substrate for the flat display device in the present invention can be used for any flat display substrate, but it is preferably used in the manufacturing process of a thin-film transistor for a TFT LCD device to form a thin-film transistor and a metal line taken as a repair line.

DETAILED DESCRIPTION OF THE PREFERRED EMBODIMENT

Example 1

Preparation of Lines

Figure 3A:
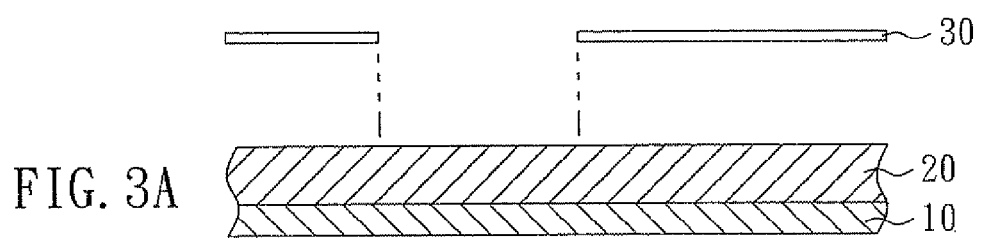
FIGS. 3A to 3H are schematic views of preparing a repair line structure in Example 1 of the present invention.
Figure 3B:
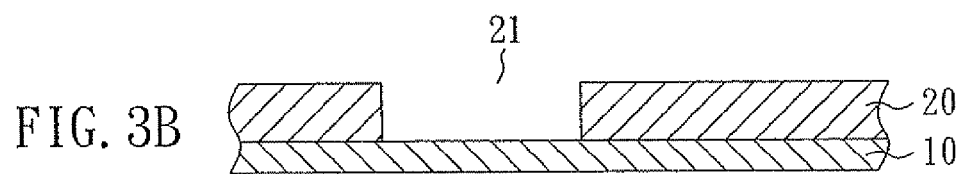

Firstly, as shown in FIG. 3A, an active-matrix flat-panel display substrate 10 is afforded, followed by the formation of a transparent layer 20 on the substrate 10 by sputtering. Herein, the transparent layer is an amorphous silicon layer. Patterning the transparent layer is realized by exposure and development in the utilization of the first mask 30 and then etching to define the plural recess 21 as the line positions. Through exposure, development and etching, the thickness range of the transparent layer 20 in the present invention is 500 Å to 2000 Å.

Figure 3C:
Figure 3D:
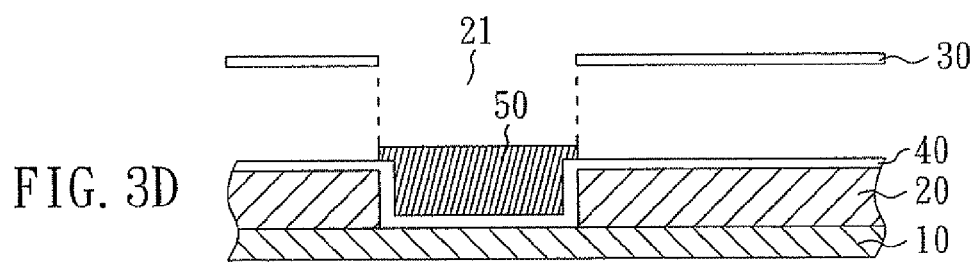
Figure 3E:
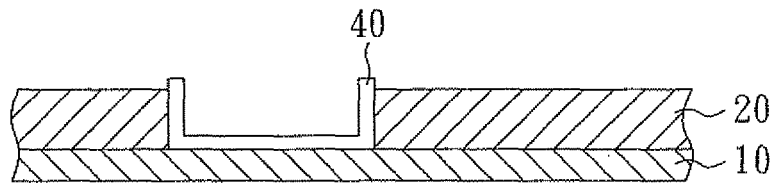

Then, a first barrier layer 40 is formed overall on the surface of the transparent layer 20 and the part substrate 10 by sputtering, as shown in FIG. 3C. Herein, TiN is taken as the first barrier layer 40. A negative photoresist layer 50 is coated on the substrate 10 overall, followed by exposure and development by the above first mask 30, as shown in FIG. 3D. Etching the first barrier layer 40 beyond the recess zones 21 is followed by stripping the negative photoresist 50, and the first barrier layer 40 is exposed, as shown in FIG. 3E.

Figure 3F:
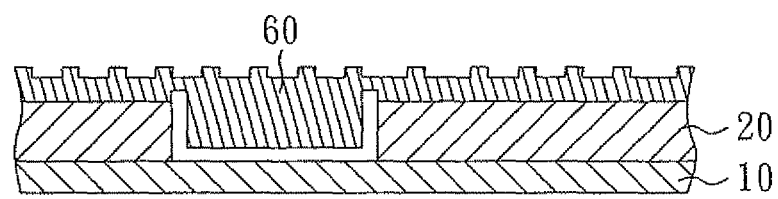
Figure 3G:
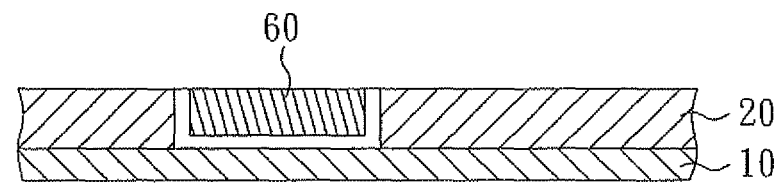

As shown in FIG. 3F, a copper layer 60 is formed as the first metal layer by plating. Herein, chemical plating or autocatalytic plating process can realize the formation of the first metal layer 60. A copper seed layer (not shown) is formed by dipping the desired-plating surface of the substrate in the copper-containing solution, and followed by dipping it in the solution comprising copper sulfate, sulfuric acid, hydrochloride acid, brighter, and a leveler. Copper ions are reduced to form the copper layer 60 deposited on the surface of the copper seed layer by the flow of current. In the example, the thickness of the copper layer is 1500 Å to 4000 Å. As shown in FIG. 3G, according to the transparent layer 20 as the end of etching, the etching process makes the surfaces of the copper layer 60 and the transparent layer 20 in substantially the same plane.

Herein, the etching process uses a sulfuric acid-hydrogen peroxide mixture, comprising hydrogen peroxide, 10~15% sulfuric acid, acetanilide, sodium phenol sulfonate, and sodium thiosulfate, as an etching liquid. The etching process can be used for various-sized glass substrates. In the example, the preferred temperature of the etching process is 40° C. to 50° C. Chemical Mechanical Planarization (CMP) can be used for the present invention, and wet etching can be used for large-sized glass substrates. In general, wet etching can be used for various-sized glass substrates and the effectiveness of production is shown.

A first insulated layer 70 is formed, followed by a semi-conductive layer 80, on the copper layer 60 and the part transparent layer 20 at a temperature lower than 300° C. by plasma-enhanced chemical vapor deposition (PECVD). In the embodiment, the material of the first insulated layer 70 is SiNx, SiOx or SiOxNy and the formed thickness is 1500 Å to 4000 Å. Herein, the semi-conductive layer 80 is a doped amorphous silicon ohmic contact layer ($n^+$/a-SiII layer), and its thickness is 500 Å to 4000 Å.

Figure 3H:
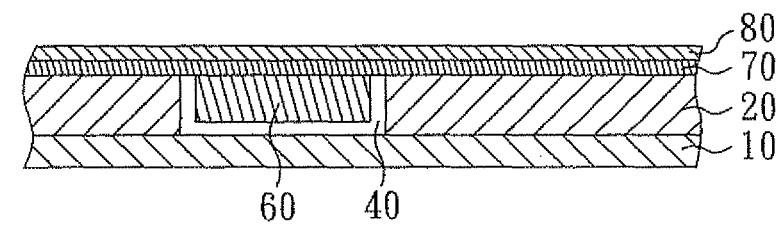

Finally, the line structure for the repair line is accomplished as shown in FIG. 3H and the example provides an inlay type line structure, including the substrate 10; the transparent layer 20; the copper layer 60 inlaid in the transparent layer 20; the first barrier layer 40 sandwiched in between the copper layer 60 and the transparent layer 20 to avoid copper ions diffusing into the transparent layer 20; the insulated layer 70 and the semi-conductive layer 80 formed on the substrate overall.

Example 2

Preparation of Lines

Figure 4A:
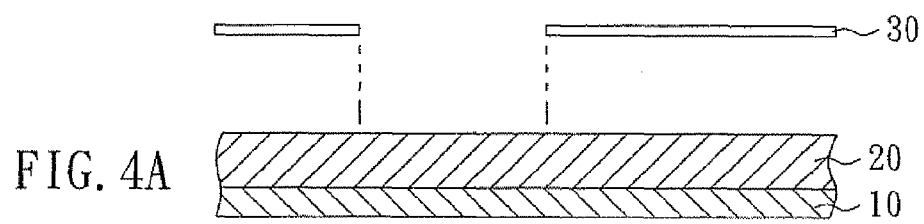
FIGS. 4A to 4I are schematic views of preparing a repair line structure with a second barrier layer in Example 2 of the present invention.
Figure 4B:
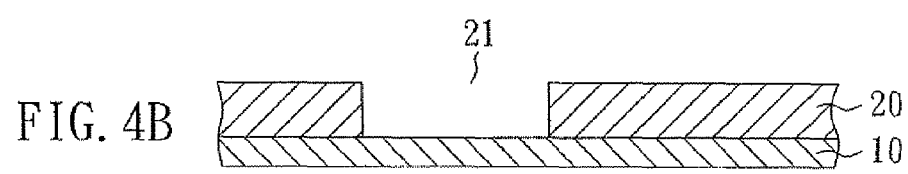
Figure 4C:
Figure 4D:
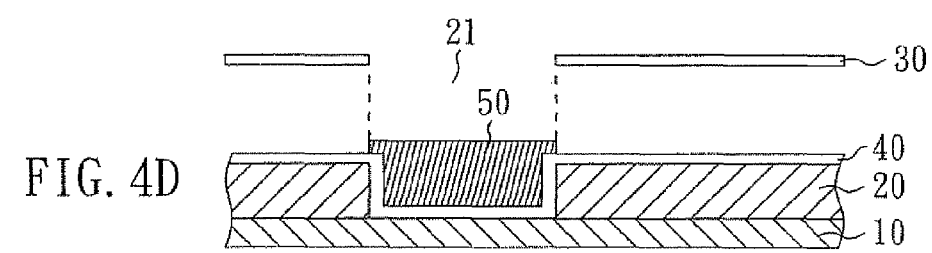
Figure 4E:
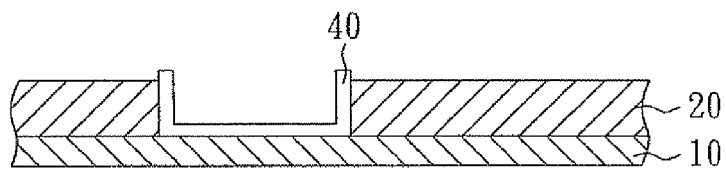
Figure 4F:
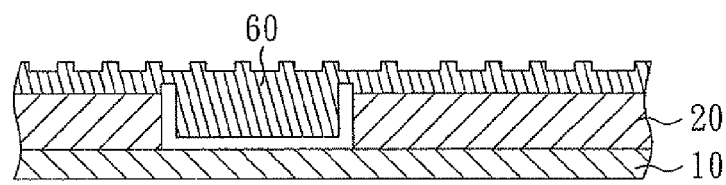
Figure 4G:
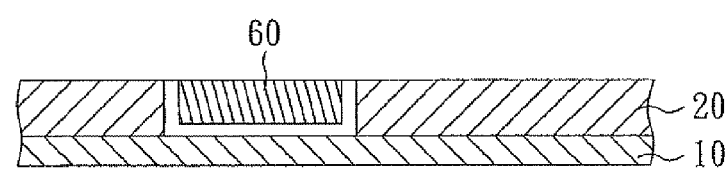
Figure 4H:
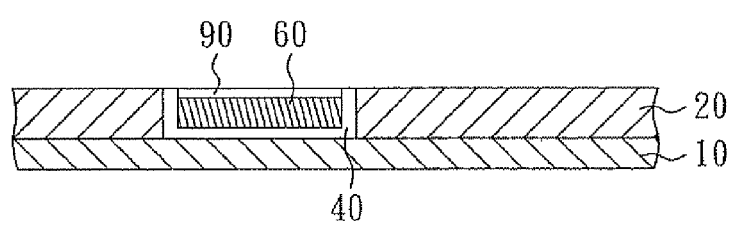

As shown in FIG. 4A to FIG. 4I, the steps shown in FIG. 4A to FIG. 4G are the same as those of FIG. 3A to FIG. 3G in Example 1. However, in the embodiment, the copper layer 60 is formed as the first metal layer by plating, and then the copper layer 60 and the transparent layer 20 are kept in substantially the same plane, followed by the formation of a second barrier layer 90 on the surface of the copper layer 60, as shown in FIG. 4H.

Herein, the formation of the second barrier layer 90 is realized by plasma-enhanced chemical vapor deposition (PECVD). The surface of the copper layer 60 reacts to form a layer of $CuSi_x$ by the $SiH_4$ gas and annealing at 350° C. The range of thickness is 150 Å to 600 Å. The second barrier layer 90 can make the surface of lines formed from copper metal have lower contact resistance.

Figure 4I:
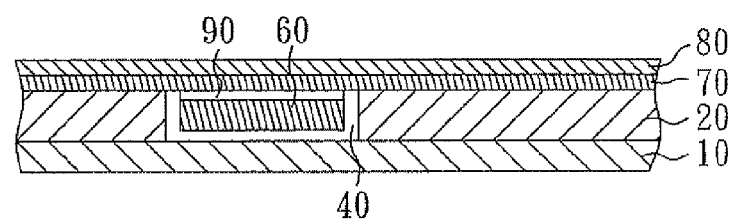

Finally, the line structure used for the repair line is accomplished by the formation of the first insulated layer 70 and then the semi-conductive layer 80 on the second barrier layer 90 and the part transparent layer 20, as shown in FIG. 4I. The embodiment provides the line structure including the substrate 10; the transparent layer 20; the copper layer 60 inlaid in the transparent layer 20; the first barrier layer 40 sandwiched in between the copper layer 60 and the transparent layer 20 to avoid copper ions diffusing into the transparent layer 20; the second barrier layer 90 sandwiched in between the copper layer 60 and the first insulated layer 70; the insulated layer 70 and the semi-conductive layer 80 formed on the substrate overall.

Figure 1A:
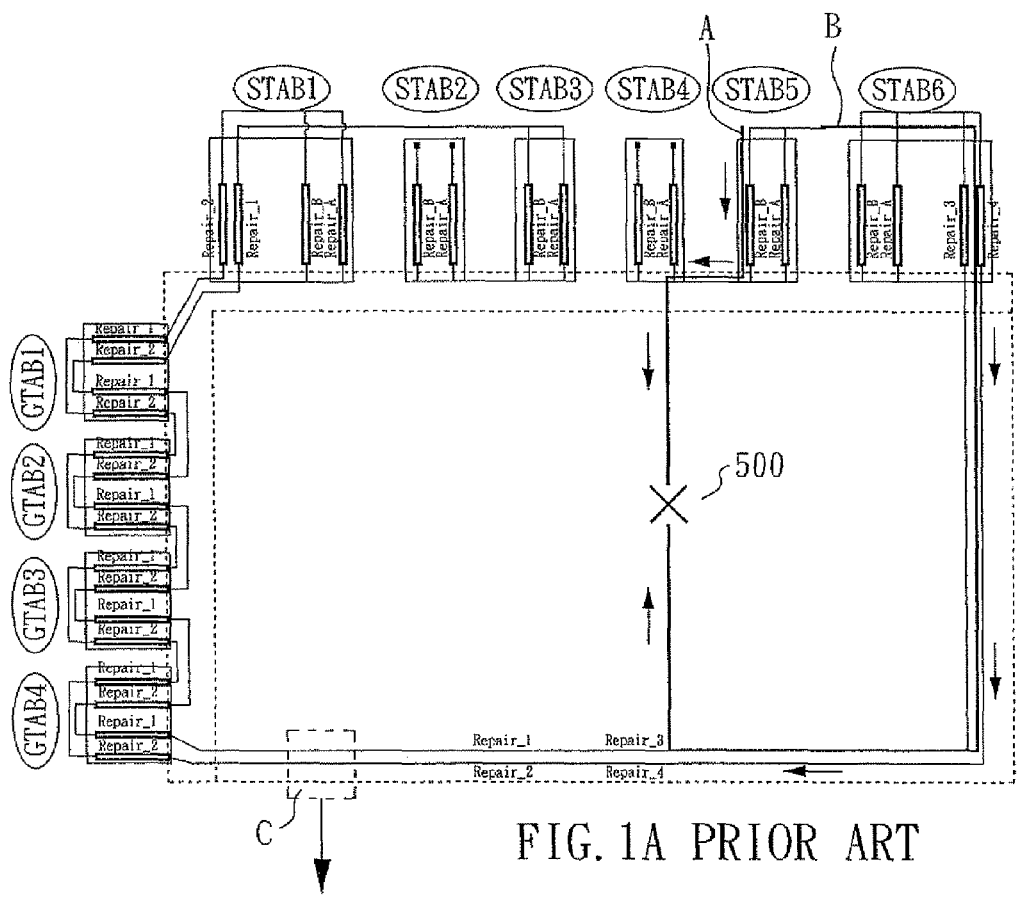
FIG. 1A is a sketch view of a pathway of a repair line, wherein a circuit of a conventional panel is broken.
Figure 1B:
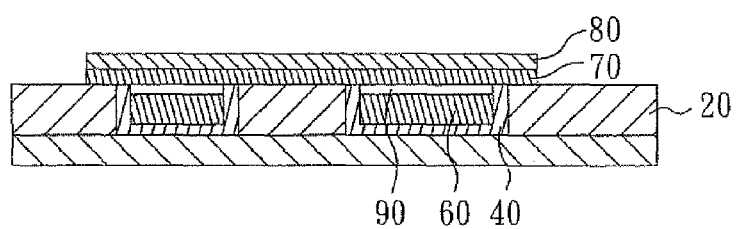
FIG. 1B is a cross-sectional view of a repair line structure with a second barrier layer in the present invention.
Figure 2A:
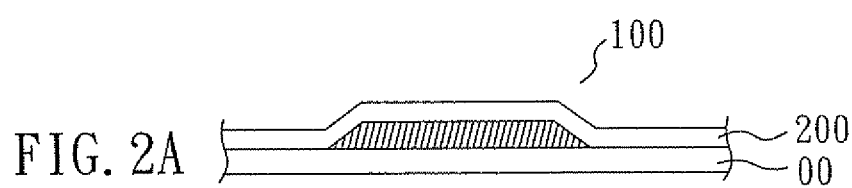
FIG. 2A is a normal gate profile of a conventional thin-film transistor structure.
Figure 2B:
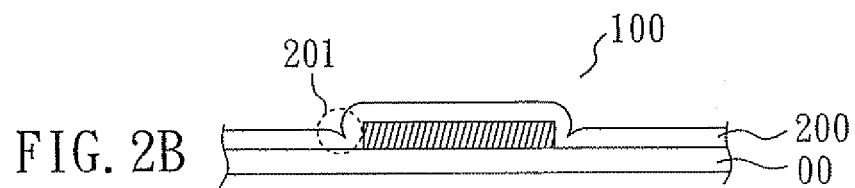
FIG. 2B is a non-normal gate profile of a conventional thin-film transistor structure.

The structure provided by the embodiment is shown in FIG. 1B, which is the cross-sectional view of the C zone in FIG. 1A. The formation of the first barrier layer 40 and the second barrier layer 90, covering the copper layer 60 overall, can avoid the conventional disadvantages including oxidation of copper, moisture corrosion, poor adherence, and inter-diffusion. Thereby, copper maintains its own preference and its application scope increases.

Example 3

Preparation of a Thin-Film Transistor (TFT) Structure

Figure 5A:
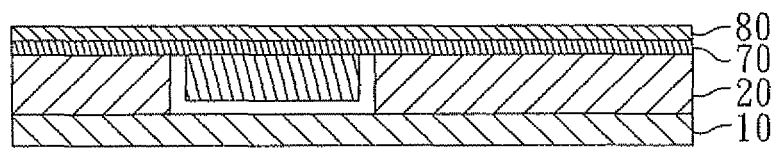
FIGS. 5A to 5G are schematic views of preparing a thin-film transistor structure in Example 3 of the present invention.

The line afforded in Example 1, as the substrate structure in FIG. 3H (e.g. FIG. 5A), can realize the preparation of a thin-film transistor (TFT) structure.

Figure 5B:
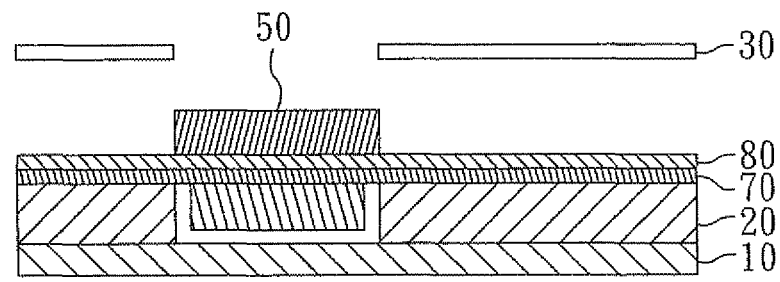
Figure 5C:
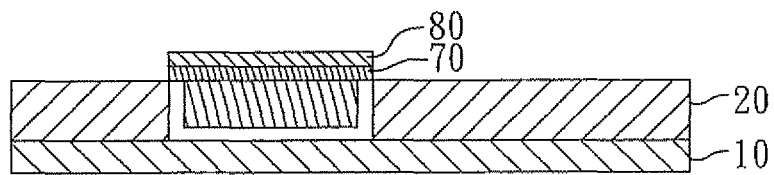

As shown in FIGS. 5B to 5G, a negative photoresist layer 50 is coated on the semi-conductive layer 80, followed by exposure and development by the above first mask 30 in Example 1 to define the island region of TFT structure (as shown in FIG. 5B). After etching and stripping the photoresist 50, the first isolated layer 70 and the semi-conductive layer 80 remain alone in the island region and the transparent layer 20 is exposed, as shown in FIG. 5C.

Figure 5D:
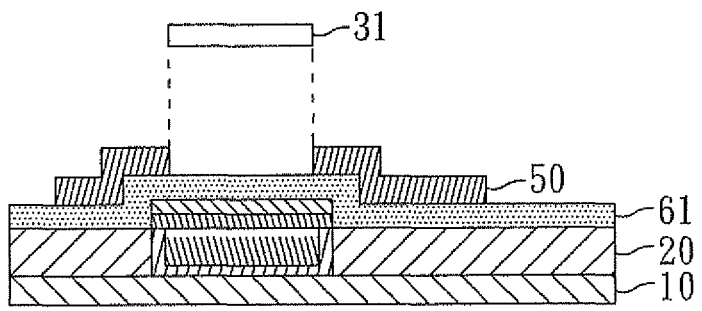

Next, a second metal layer 61 is coated overall on the semi-conductive layer 80 and the transparent layer 20, followed by coating the photoresist layer 50 on the second metal layer 61. A second mask 31 is used for exposure and development. Herein, the second metal layer 61 can be the multi-level structure (as shown in FIG. 5D) formed by TiN, Al—Cu alloy, Ti or TiN, Al—Si—Cu alloy, and Ti, the thickness range is 1000 Å to 3000 Å.

Figure 5E:
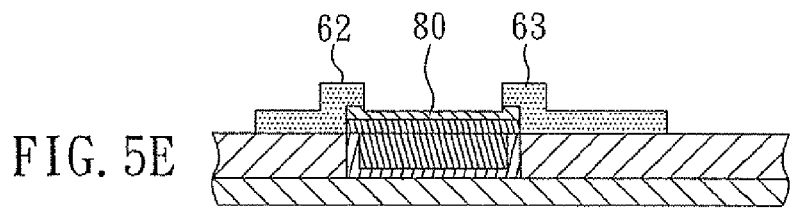

Etching is performed and the photoresist 50 is removed to define the source structure 62 and the drain structure 63 of the second metal layer 61 in a TFT structure, and the semi-conductive layer 80 is exposed, as shown in FIG. 5E. Then, the transparent electrode layer 25 (including IZO or ITO) and the photoresist layer 50 are coated overall on the second metal layer 61, the semi-conductive layer 80 and the transparent layer 20 so as to make the transparent electrode layer 25 contact the transparent layer 20 directly. In the embodiment, the transparent electrode layer 25 contacts the transparent layer 20 directly without the passivation layer because the reaction between Al—Cu alloy (or Al—Si—Cu alloy) of the second metal layer 61 and IZO is not smooth. Herein, the thickness range of the transparent electrode layer 25 is about 500 Å to 3000 Å.

Figure 5F:
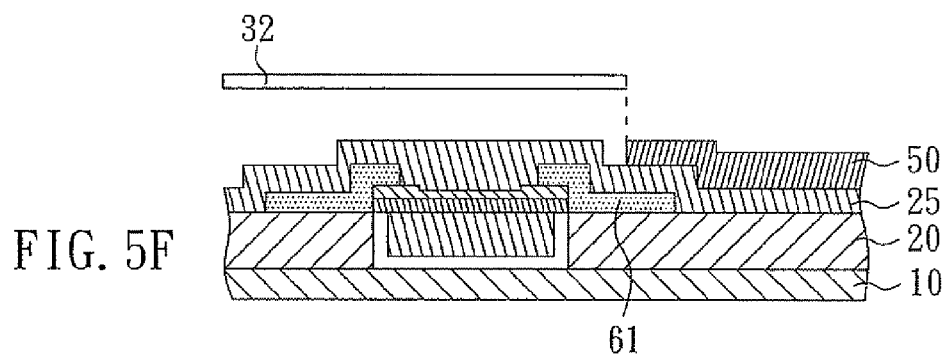

The transparent electrode layer 25 is patterned by a third mask 32, as shown in FIG. 5F. Herein, the transparent electrode layer 25 electrically connects with the drain structure 63. Finally, the preparation of thin-film transistor (TFT) structure is accomplished after slipping the photoresist and etching, as shown in FIG. 5G.

Figure 5G:
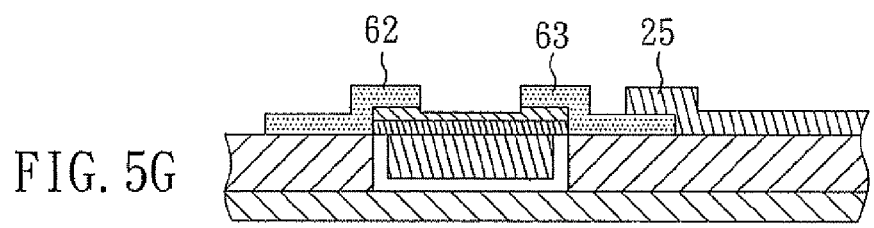

The structure in FIG. 5G is a thin-film transistor (TFT) structure containing an inlay type gate line, including the substrate 10; the transparent layer 20; the copper layer 60 inlaid in the transparent layer 20 to be the gate line; the first barrier layer 40 sandwiched in between the copper layer 60 and the transparent layer 20 to avoid copper ions diffusing into the transparent layer 20; the insulated layer 70 formed on the copper layer 60; the semi-conductive layer 80 formed on the insulated layer; the source line 62 and the drain line 63 formed on the part edge of the semi-conductive layer 80, where the source line 62 does not electrically connect with the drain line 63; the transparent electrode layer formed on the part transparent layer and the part drain line 63 electrically connecting with the transparent electrode layer.

Example 4

Preparation of a Thin-Film Transistor (TFT) Structure

Figure 6A:
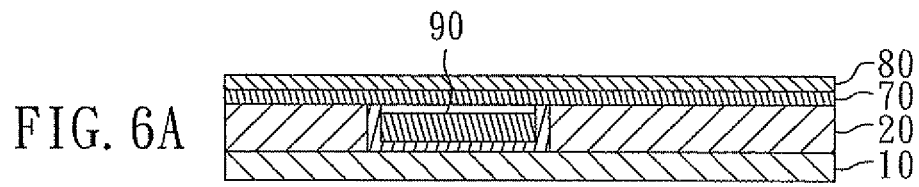
FIGS. 6A to 6G are schematic views of preparing a thin-film transistor structure with a second barrier layer in Example 4 of the present invention.
Figure 6B:
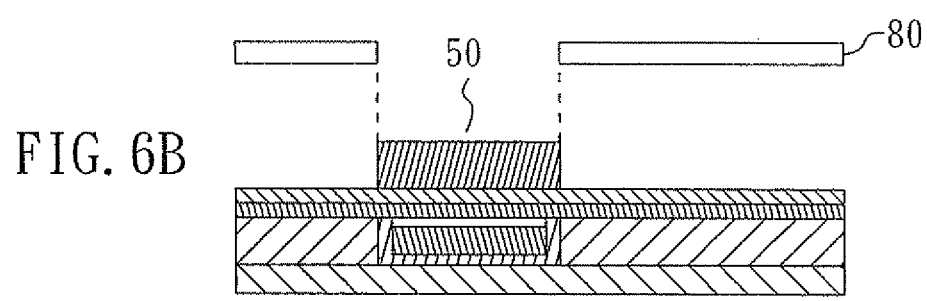
Figure 6C:
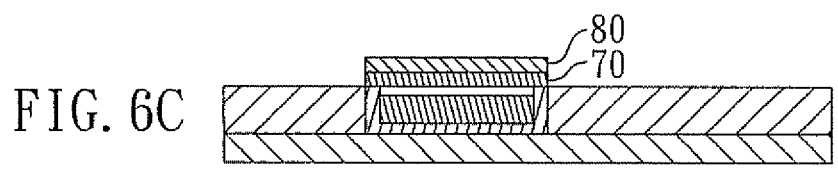
Figure 6D:
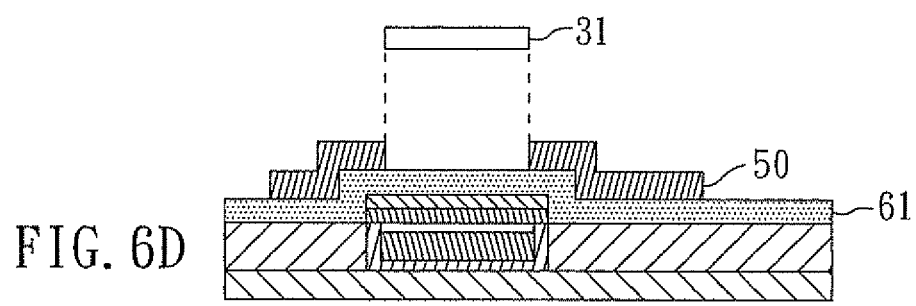
Figure 6E:
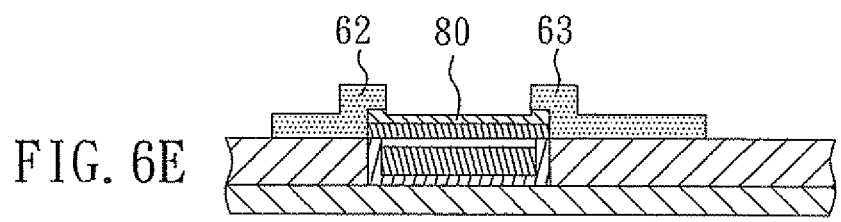
Figure 6F:
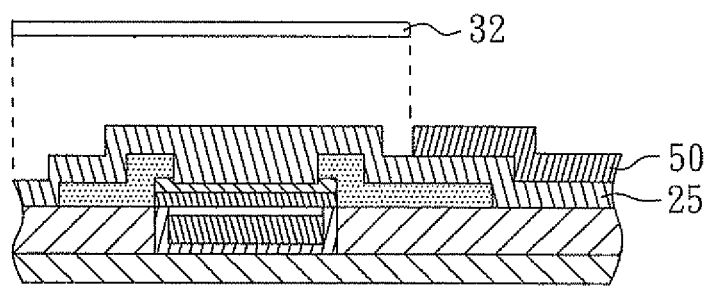

The repair line with the second barrier layer 90 accomplished in Example 2, as the substrate structure in FIG. 4I (i.e. FIG. 6A), can realize the preparation of a thin-film transistor (TFT) structure.

Figure 6G:
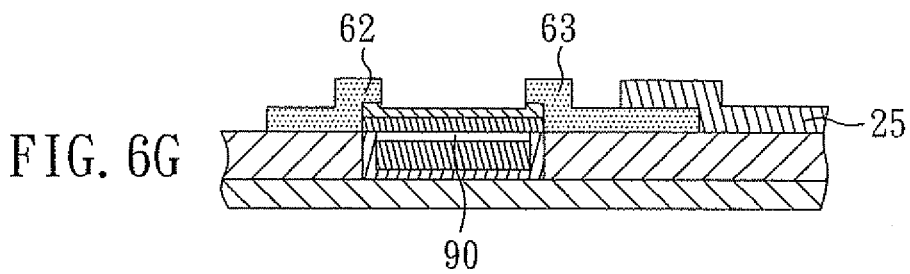

The steps shown in FIGS. 6B to 6G are the same as those of FIGS. 5B to 5G in Example 3. The structure of a thin-film transistor is shown in FIG. 6G.

The structure in FIG. 6G is the thin-film transistor (TFT) structure containing an inlay type gate line to protect the copper metal more perfectly. Herein, the first barrier layer 40 and the second barrier layer 90 cover the copper layer taken as the gate line. The structure includes the substrate 10; the transparent layer 20; the copper layer 60 inlaid in the transparent layer 20 to be the gate line; the first barrier layer 40 sandwiched in between the copper layer 60 and the transparent layer 20 to avoid copper ions diffusing into the transparent layer 20; the second barrier layer 90 sandwiched in between the copper layer 60 and the insulated layer 70; the insulated layer 70 formed on the second barrier layer 90; the semi-conductive layer 80 formed on the insulated layer 70; the source line 62 and the drain line 63 formed on the part edge of the semi-conductive layer 80, where the source line 62 does not electrically connect with the drain line 63; the transparent electrode layer formed on the part transparent layer and the part drain line 63 electrically connecting with the transparent electrode layer.

The present invention takes the metal with low resistance rate as the metal line or the gate line of the flat display substrate so as to enhance the rate of TFT-driving signal transmission and resolve RC delay. The barrier layer can resolve the disadvantages in using copper, including fast oxidation, moisture corrosion, poor adherence, and inter-diffusion.

Although the present invention has been explained in relation to its preferred embodiment, it is to be understood that many other possible modifications and variations can be made without departing from the spirit and scope of the invention as hereinafter claimed.

What is claimed is:

1. A thin-film transistor structure, comprising:
   a substrate;
   a transparent layer having a recess filled with a first metal layer and a first barrier layer which is sandwiched in between the first metal layer and the transparent layer;
   an insulated layer formed on the first metal layer;
   a semi-conductive layer formed on the insulated layer, wherein the insulated layer and semi-conductive layer have the same pattern from a top view with respect to the recess where the first metal layer and a first barrier layer been filled therein;
   a source metal layer and a drain metal layer formed on the part edge of the semi-conductive layer, wherein the source metal layer and the drain metal layer include a multilayer structure of TiN/Al—Cu alloy/Ti or TiN/Al—Si—Cu alloy/Ti; and
   a transparent electrode layer formed on the part transparent layer and the part drain metal layer which electrically connects with the transparent electrode layer.

2. The structure as claimed in claim 1, further comprising a second barrier layer located between the first metal layer and the insulated layer.

3. The structure as claimed in claim 2, wherein the surfaces of the second barrier layer and the transparent layer are substantially in the same plane.

4. The structure as claimed in claim 2, wherein the second barrier layer is a layer of $CuSi_x$.

5. The structure as claimed in claim 1, wherein the material of the first barrier layer comprises a material selected from the group consisting of silica, silicon nitride, aluminum oxide, tantalum oxide, titanium nitride, indium tin oxide, silicon carbide, silicon carbide doped with nitrogen and oxygen, molybdenum, chromium, titanium, nickel, tungsten, ruthenium, cobalt, phosphorus, and a combination thereof.

6. The structure as claimed in claim 1, further comprising a seed layer located between the first metal layer and the first barrier layer.

7. The structure as claimed in claim 6, wherein the material of the seed layer includes a material selected from the group consisting of gold, silver, copper, nickel, tungsten, molybdenum, cobalt, ruthenium, titanium, zirconium, hafnium, niobium, tantalum, vanadium, chromium, manganese, iron, palladium, platinum, aluminum, a combination thereof, an alloy thereof, and a derivate of the above metal doped with the element including phosphorus or boron.

8. The structure as claimed in claim 1, wherein the first metal layer comprises copper or a copper alloy.

9. The structure as claimed in claim 1, wherein the transparent layer comprises an amorphous silicon layer.

10. The structure as claimed in claim 1, wherein the thickness of the transparent layer ranges from 500 Å to 2000 Å.

11. An array substrate of a display device, comprising:
a substrate;
a transparent layer having plural recesses each filled with a first metal layer and a first barrier layer which is sandwiched in between the first metal layer and the transparent layer, wherein the first metal layer in the recesses constitutes at least one gate electrode and at least one gate line;
an insulated layer formed on the first metal layer;
a semi-conductive layer formed on the insulated layer, wherein the insulated layer and the semi-conductive layer have the same pattern from a top view with respect to the recesses where the first metal layer and a first barrier layer been filled therein;
a second metal layer formed on the part edge of the semi-conductive layer and the part transparent layer to form at least one source electrode and at least one drain electrode, wherein the second metal layer includes a multi-layer structure of TiN/Al—Cu alloy/Ti or TiN/Al—Si—Cu alloy/Ti; and
a transparent electrode layer formed on the part transparent layer and the part drain electrode electrically connected with the transparent electrode layer.

12. The array substrate as claimed in claim 11, further comprising a second barrier layer located between the first metal layer and the insulated layer.

13. The array substrate as claimed in claim 12, wherein the second barrier layer is a layer of $CuSi_x$.

14. The array substrate as claimed in claim 11, wherein the material of the first barrier layer comprises a material selected from the group consisting of silica, silicon nitride, aluminum oxide, tantalum oxide, titanium nitride, indium tin oxide, silicon carbide, silicon carbide doped with nitrogen and oxygen, molybdenum, chromium, titanium, nickel, tungsten, ruthenium, cobalt, phosphorus, and a combination thereof.

15. The array substrate as claimed in claim 11, further comprising a seed layer located between the first metal layer and the first barrier layer.

16. The structure as claimed in claim 11, wherein the first metal layer comprises copper or a copper alloy.

17. The array substrate as claimed in claim 11, wherein the transparent layer comprises an amorphous silicon layer.

18. The array substrate as claimed in claim 11, wherein the thickness of the transparent layer ranges from 500 Å to 2000 Å.

19. The structure as claimed in claim 11, wherein the first metal layer in the recesses further constitute a repair line.

\* \* \* \* \*